(12) United States Patent
Ichizono et al.

(10) Patent No.: US 8,686,455 B2
(45) Date of Patent: Apr. 1, 2014

(54) COMPOSITE SUBSTRATE FOR FORMATION OF LIGHT-EMITTING DEVICE, LIGHT-EMITTING DIODE DEVICE AND MANUFACTURING METHOD THEREOF

(75) Inventors: Yasuyuki Ichizono, Ube (JP); Hideki Hirayama, Wako (JP)

(73) Assignees: Ube Industries, Ltd. (JP); Riken (JP)

( * ) Notice: Subject to any disclaimer, the term of this patent is extended or adjusted under 35 U.S.C. 154(b) by 268 days.

(21) Appl. No.: 13/203,853

(22) PCT Filed: Mar. 2, 2010

(86) PCT No.: PCT/JP2010/053727
§ 371 (c)(1),
(2), (4) Date: Aug. 30, 2011

(87) PCT Pub. No.: WO2010/101272
PCT Pub. Date: Sep. 10, 2010

(65) Prior Publication Data
US 2012/0025252 A1  Feb. 2, 2012

(30) Foreign Application Priority Data
Mar. 3, 2009 (JP) ................. 2009-049833

(51) Int. Cl.
*H01L 33/00* (2010.01)
(52) U.S. Cl.
USPC  257/98; 257/101; 257/E33.025; 257/E33.028; 257/E33.003; 257/E33.061; 438/29; 438/36; 438/37; 438/46
(58) Field of Classification Search
None
See application file for complete search history.

(56) References Cited

U.S. PATENT DOCUMENTS

| | | |
|---|---|---|
| 5,998,925 A | 12/1999 | Shimizu et al. |
| 2003/0176001 A1 | 9/2003 | Fukuyama et al. |

(Continued)

FOREIGN PATENT DOCUMENTS

| | | |
|---|---|---|
| EP | 1 811 580 | 7/2007 |
| JP | 10-075018 A | 3/1998 |

(Continued)

OTHER PUBLICATIONS

Sang, L. W., et al., "Reduction in threading dislocation densities in AlN epilayer by introducing a pulsed atomic-layer epitaxial buffer layer," Applied Physics Letters, 2008, vol. 93, No. 12, pp. 122104-1-1221040-3.

(Continued)

*Primary Examiner* — Yasser A Abdelaziez
(74) *Attorney, Agent, or Firm* — DLA Piper LLP (US)

(57) ABSTRACT

A composite substrate for the formation of a light-emitting device, ensuring that a high-quality nitride-based light-emitting diode can be easily formed on its top surface and the obtained substrate-attached light-emitting diode functions as a light-emitting device capable of emitting light for an arbitrary color such as white, is provided. A composite substrate for the formation of a light-emitting device, comprising a light-converting material substrate for radiating at least a part of incident light as light different in the wavelength through the surface opposite the incident surface, and at least two or more Al-containing nitride layers formed on the light-converting material substrate, wherein the light-converting material substrate has a texture comprising two or more oxide phases continuously and three-dimensionally entangled with each other, including an $Al_2O_3$ phase and at least one fluorescence-emitting oxide phase, and the nitride layer has a first layer of an Al-containing nitride layer formed on the light-converting material substrate and a second layer of AlN having a dislocation density of $1 \times 10^{12}/cm^2$ or less and preferably having a surface roughness (RMS) of 10 nm or less.

19 Claims, 4 Drawing Sheets

(56) References Cited

U.S. PATENT DOCUMENTS

| | | |
|---|---|---|
| 2006/0017073 A1 | 1/2006 | Hata et al. |
| 2008/0283853 A1 | 11/2008 | Mitani et al. |
| 2010/0301358 A1* | 12/2010 | Shibata et al. .................. 257/98 |

FOREIGN PATENT DOCUMENTS

| | | |
|---|---|---|
| JP | 2000-133842 | 5/2000 |
| JP | 2000-208815 A | 7/2000 |
| JP | 2005-183930 A | 7/2005 |
| JP | 2006-080378 A | 3/2006 |
| JP | 2007290924 | * 11/2007 |
| WO | 2006/043719 A1 | 4/2006 |
| WO | 2006/098250 | 9/2006 |

OTHER PUBLICATIONS

Li, Da-Bing, et al., "Improved surface morphology of flow-modulated MOVPE grown AIN on sapphire using thin medium-temperature AIN buffer layer," Applied Surface Science, 2007, vol. 253, pp. 9395-9399.

European Supplementary Search Report dated Nov. 6, 2013.

* cited by examiner

COMPOSITE SUBSTRATE FOR FORMATION OF LIGHT-EMITTING DEVICE, LIGHT-EMITTING DIODE DEVICE AND MANUFACTURING METHOD THEREOF

TECHNICAL FIELD

The present invention relates to a substrate for the formation of a light-emitting device. More specifically, the present invention relates to a composite substrate for the formation of a light-emitting device, using a light-converting material substrate, and a method for forming the same.

BACKGROUND ART

Recently, a white light-emitting diode where a blue light-emitting element using a nitride-based compound semiconductor is utilized as the light emission source is being developed and studied, and since this is a lightweight, mercury-free and long-life device, demands therefor are expected to expand in the future. In a currently most common white light-emitting diode device, as described, for example, in Patent Document 1, a coating layer containing a fluorescent material capable of emitting yellow light by absorbing a part of blue light, and a mold layer for mixing blue light from the light source with yellow light from the coating layer are provided on the entire surface of a light-emitting element capable of emitting blue light, and a pseudo-white color is obtained by mixing blue and yellow colors which are in the complementary color relationship. As the coating layer, a mixture powder of cerium-activated YAG ($Y_3Al_5O_{12}$:Ce) powder and epoxy resin has been conventionally employed. However, in this method, when applying the coating layer, for example, distribution unevenness of the contained fluorescent material powder or fluctuation in the amount of the fluorescent material powder among light-emitting diode individuals may occur and in turn, the light-emitting diode suffers from color unevenness.

In order to avoid such a problem, in Patent Document 2, a white light-emitting diode device obtained by forming a blue diode element having a light-emitting layer composed of InGaN on a substrate with the principal surface being the $Al_2O_3$ (0001) plane of a material having a texture where $Al_2O_3$ and $Y_3Al_5O_{12}$:Ce are continuously and three-dimensionally entangled, has been reported. In the white light-emitting diode device of this report, a method of causing blue light emitted from the light-emitting layer to be incident directly on the substrate, allowing transmission of the blue light in the $Al_2O_3$ phase, and emitting homogeneous yellow light in the $Y_3Al_5O_{12}$:Ce phase, thereby efficiently extracting light only by a light-emitting chip without use of a fluorescent material powder-containing coating layer and obtaining homogeneous white light free from color unevenness, has been proposed.

RELATED ART

Patent Document

Patent Document 1: Japanese Unexamined Patent Publication (Kokai) No. 2000-208815
Patent Document 2: WO2006/043719

SUMMARY OF THE INVENTION

Problems to be Solved by the Invention

However, according to the method described in Patent Document 2, a device having characteristics equal to or better than those of the conventional blue light-emitting diode device is difficult to form on the light-converting material substrate by using a known method, and there is a limit to obtain an excellent white light-emitting diode device. Since, different phases, for example, $Al_2O_3$ phase and $Y_3Al_5O_{12}$ phase, are present in the light-converting material substrate. The substrate used in the conventional blue light-emitting diode device is, for example, sapphire having a similar crystal structure, or GaN having the same crystal structure. Therefore, when a GaN layer is formed on the light-converting material layer by a known technology of forming a nitride compound layer by using sapphire or GaN as the substrate, the GaN layer may be preferentially formed on the $Al_2O_3$ phase, but the GaN layer cannot be formed on the $Y_3Al_5O_{12}$:Ce phase having a large lattice mismatch ratio with GaN or even if the layer can be formed, surface smoothness or crystallinity is low wand deterioration in the characteristics of the blue light-emitting diode device is incurred.

Under these circumstances, in order to solve these problems, an object of the present invention is to provide a composite substrate for the formation of a light-emitting device, ensuring that a high-quality nitride-based light-emitting diode can be easily formed on its top surface and the obtained substrate-attached light-emitting diode functions as a light-emitting device capable of emitting light for an arbitrary color such as white.

Means to Solve the Problems

As a result of continuous and intensive studies on the composite substrate for the formation of a light-emitting deice, the present inventors have found that when an Al-containing nitride layer is formed by a specific method on a light-converting material layer having a texture comprising two or more oxide layers continuously and three-dimensionally entangled with each other, said two or more oxide phases including an $Al_2O_3$ phase and at least one fluorescence-emitting oxide phase, a flat AlN layer having little defects is formed on the outermost surface of the layer, a GaN-based light-emitting diode element with excellent emission characteristics can be formed thereon and an excellent light-emitting diode device is obtained. The present invention has been accomplished based on this finding.

That is, the present invention relates to a composite substrate for the formation of a light-emitting device, comprising a light-converting material substrate for radiating at least a part of incident light as light different in the wavelength through the surface opposite the incident surface, and at least two or more Al-containing nitride layers formed on the light-converting material substrate, wherein the light-converting material substrate has a texture comprising two or more oxide phases continuously and three-dimensionally entangled with each other, the two or more oxide phases including an $Al_2O_3$ phase and at least one fluorescence-emitting oxide phase, the nitride layers have a first layer of an Al-containing nitride layer formed on each oxide phase constituting the light-converting material substrate and a second layer of a continuously continuing AlN layer with a flat and defectless surface formed on the first layer. More specifically, the second layer has a dislocation density of $1\times10^{12}/cm^2$ or less and more preferably has a surface roughness (root-mean-square roughness, RMS) of 5 nm or less.

In the light-converting material substrate for use in the present invention, each of the first layer and the second layer forms a uniform continuous layer extending across all phases of the two or more oxide phases of the light-converting material substrate. In a preferred embodiment, each of the first layer and the second layer in the light-converting material substrate contains substantially no void.

In the present invention, the fluorescence-emitting oxide phase of the light-converting material substrate is $Y_3Al_5O_{12}$:Ce phase, and $Al_2O_3$ (0001) plane and $Y_3Al_5O_{12}$ (111) plane are principal surfaces.

In the present invention, the Al-containing nitride layer of the first layer and the AlN layer of the second layer are grown as crystals by the MOCVD method on the light-converting material substrate.

In the present invention, the Al-containing nitride layer of the first layer is AlN.

In the present invention, the film thickness of the first layer is from 0.1 to 5 μm.

In the present invention, the film thickness of the second layer is from 2 to 9 μm.

The present invention also relates to a light-emitting diode device comprising a semiconductor light-emitting layer formed on the composite substrate for the formation of a light-emitting device claimed in claim 1, the light-emitting diode device having a function of radiating light after wavelength conversion of at least a part of light from the semiconductor light-emitting light through the composite substrate for the formation of a light-emitting device.

Also, the present invention relates to a light-emitting diode device comprising a semiconductor light-emitting layer capable of emitting blue light on the composite substrate for the formation of a light-emitting device claimed in claim 2, the light-emitting diode device having a function of radiating light after wavelength conversion of a part of light from the semiconductor light-emitting light, together with light from the semiconductor light-emitting layer, through the composite substrate for the formation of a light-emitting device.

The present invention relates to a method for producing the above-described composite substrate for the formation of a light-emitting device (claimed in claim 1), comprising a first step of subjecting a light-converting material substrate having a texture comprising two or more oxide phases continuously and three-dimensionally entangled with each other said two or more oxide phases including an $Al_2O_3$ phase and at least one fluorescence-emitting oxide phase, for radiating at least a part of incident light as light different in the wavelength through the surface opposite the incident surface to a heat treatment at 1,000 to 1,300° C. in a mixed gas atmosphere of an $H_2$ gas, an $N_2$ gas and an $NH_3$ gas, a second step of supplying at least an $H_2$ gas, an $N_2$ gas, an $NH_3$ gas and an Al-containing organic metal compound gas on the light-converting material substrate to form a first layer of Al-containing nitride layer, and a third step of supplying a mixed gas of an $H_2$ gas, an $N_2$ gas, an $NH_3$ gas and an Al-containing organic metal compound gas on the first layer to form a second layer of AlN at 1,350 to 1,480° C.

In the present invention, the first step, the second step and the third step are performed by the MOCVD method.

In the present invention, the molar ratio between N in the $NH_3$ gas and Al in the Al-containing organic metal compound gas in the third step is smaller than the molar ratio between N in the $NH_3$ gas and Al in the Al-containing organic metal compound gas in the second step.

In the present invention, the heat treatment time period in the first step is from 10 to 90 minutes.

In the present invention, the Al-containing nitride layer is of AlN.

Effects of the Invention

The composite substrate for the formation of a light-emitting device of the present invention is a substrate comprising an Al-containing nitride layer and an outermost surface layer of AlN on a light-converting material substrate comprising an $Al_2O_3$ phase and an oxide phase containing a fluorescence-emitting activator, and the surface smoothness and crystallinity of the outermost AlN layer are high. Therefore, a high-quality light-emitting diode device capable of emitting light for an arbitrary color can be easily formed using the composite substrate, and the obtained substrate-attached light-emitting diode device can emit light for an arbitrary color with excellent characteristics by way of mixing with the fluorescence of the light-converting material substrate.

Also, in the present invention, yellow light emission is exhibited when using Ce as the fluorescence-emitting activator, and white light can be emitted by forming a blue light-emitting diode on the composite substrate for the formation of a light-emitting device, where Ce is used as the activator.

MODE FOR CARRYING OUT THE INVENTION

Figure 1:
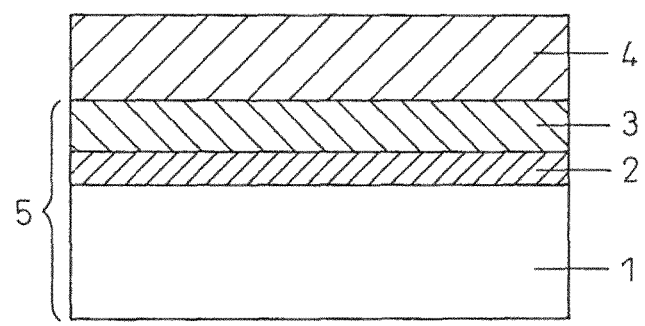
FIG. 1 is a schematic view of the cross-sectional shape of the composite substrate for the formation of a light-emitting device of the present invention.

In an embodiment of the present invention, the composite substrate for the formation of a light-emitting device of the present invention is described.

The light-converting material substrate constituting the composite substrate for the formation of a light-emitting device of the present invention is a solidified body formed of at least two or more oxide phases selected from a single metal oxide and a complex metal oxide continuously and three-dimensionally entangled with each other. At least one of the oxide phases in the solidified body is an $Al_2O_3$ crystal phase, and at least one of the oxide phases in the solidified body contains a fluorescence-emitting metal element oxide. The $Al_2O_3$ crystal phase has a property of allowing transmission of ultraviolet ray, visible light and infrared ray, which are at a wavelength of 200 to 4,000 nm. In the light-converting material substrate constituting the composite substrate for the formation of a light-emitting device of the present invention, at least the $Al_2O_3$ crystal phase transmits light (for example, blue light) from a light-emitting layer formed on the substrate, at least one light-emitting layer absorbs light and emits fluorescence (for example, yellow light), the transmitted light and the fluorescence are mixed, and the mixed light (for example, white light) is released (emitted) from the side opposite the light-emitting layer of the light-converting material substrate, i.e., from the light-emitting device.

The single metal oxide is an oxide of one kind of a metal, and a complex metal oxide is an oxide of two or more kinds of metals. The light-converting material substrate has a structure where respective oxides are in a single crystal state and three-dimensionally entangled with each other. Examples of the single metal oxide include $Al_2O_3$, $ZrO_2$, MgO, $SiO_2$, $TiO_2$, BaO, BeO, CaO, $Cr_2O_3$, and a rare earth element oxide such as $La_2O_3$, $Y_2O_3$, $CeO_2$, $Pr_6O_{11}$, $Nd_2O_3$, $Sm_2O_3$, $Gd_2O_3$, $Eu_2O_3$, $Tb_4O_7$, $Dy_2O_3$, $Ho_2O_3$, $Er_2O_3$, $Tm_2O_3$, $Yb_2O_3$ and $Lu_2O_3$. Examples of the complex metal oxide include $LaAlO_3$, $CeAlO_3$, $PrAlO_3$, $NdAlO_3$, $SmAlO_3$, $EuAlO_3$, $GdAlO_3$, $DyAlO_3$, $ErAlO_3$, $Yb_4Al_2O_9$, $Y_3Al_5O_{12}$, $Er_3Al_5O_{12}$, $Tb_3Al_5O_{12}$, $11Al_2O_3 \cdot La_2O_3$, $11Al_2O_3 \cdot Nd_2O_3$, $3Dy_2O_3 \cdot 5Al_2O_3$, $2Dy_2O_3 \cdot Al_2O_3$, $11Al_2O_3 \cdot Pr_2O_3$, $EuAl_{11}O_{18}$, $2Gd_2O_3 \cdot Al_2O_3$, $11Al_2O_3 \cdot Sm_2O_3$, $Yb_3Al_5O_{12}$, $CeAl_{11}O_{18}$, and $Er_4Al_2O_9$.

The at least two or more oxide phases selected from a single metal oxide and a complex metal oxide of the light-converting material substrate are not limited in the dimension of each phase on the substrate surface, but, for example, the complex meal oxide phase has a dimension such that the major axis is from tens of μm to hundreds of μm and the minor axis is from several μm to tens of μm.

While the light-converting material substrate constituting the present invention is composed of two or more kinds of oxide phases, individual oxide phases differ in the refractive index and therefore, total reflection on the inner surface of the substrate is unlikely to occur due to refraction reflection in various directions at the interface between oxide phases, so that a high light extraction efficiency can be also obtained. Furthermore, since the light-converting material substrate is a fluorescent material, more uniform fluorescence can be emitted using light from the light-emitting layer in the semiconductor layer.

Particularly, in the case where the substrate for the formation of a light-emitting device is used as the substrate for a white light-emitting diode device, a single crystal of garnet-type crystal that is a complex metal oxide where the oxide phase capable of emitting fluorescence is activated with Ce, is preferred. The garnet-type crystal is represented by the structural formula of $A_3X_5O_{12}$, and it is more preferred that one or more elements selected from the group consisting of Y, Tb, Sm, Gd, La and Er are contained in A of the structural formula and similarly, one or more elements selected from Al and Ga are contained in X of the structural formula. Above all, Ce-activated $Y_3Al_5O_{12}$ emits strong fluorescence and is preferred. In this case, the light-converting material substrate is constituted of an $Al_2O_3$ single crystal and a $Y_3Al_5O_{12}$:Ce single crystal, where respective oxide phases formed are continuously and three-dimensionally entangled with each other, and the substrate as a whole consists of the two single crystal phases. The cutting direction of this light-converting material is preferably a direction allowing $Al_2O_3$ (0001) plane and $Y_3Al_5O_{12}$ (111) plane to serve as principal surfaces. In this regard, when a semiconductor layer represented by $In_xAl_yGa_{1-x-y}N$ ($0 \leq x \leq 1$, $0 \leq y \leq 1$, $0 \leq x+y \leq 1$) is formed on the light-converting material substrate, since $In_xAl_yGa_{1-x-y}N$ ($0 \leq x \leq 1$, $0 \leq y \leq 1$, $0 \leq x+y \leq 1$) has a hexagonal crystal structure, the lattice matching between the $Al_2O_3$ (0001) plane and the $Y_3Al_5O_{12}$ (111) plane is relatively good and a high-quality semiconductor layer can be formed.

The first layer constituting the present invention is an Al-containing nitride layer, and the nitride layer may be a single layer or a plurality of layers.

By virtue of being an Al-containing nitride layer, the first layer enables a uniform continuous film to be formed across both an $Al_2O_3$ phase and an oxide phase containing at least one fluorescence-emitting oxide phase, which are constituting the light-converting material substrate. Here, the uniform continuous film indicates that the first layer is formed on the entire surface of the substrate and a discontinuous region is not present in the first layer (compare the discontinuous layer of FIG. 5 with the continuous layer of FIGS. 2 and 4). Also, in the light-converting material substrate for use in the present invention, the first layer forms a uniform continuous layer across all phases of two or more oxide phases of the light-converting material substrate and therefore, when the second layer is formed thereon, the substrate, the first layer and the second layer are continuing over the entire surface of the substrate also in the direction perpendicular to the substrate, preferably allowing for substantially no formation of a void between the substrate and the second layer (a void due to incomplete continuity of the first layer).

Also, the first layer has a role as a buffer layer when forming the second layer of an AlN layer and by forming the first layer, it is possible to contain no crystal grain boundary in the second layer formed on respective phases of the $Al_2O_3$ phase and the $Y_3Al_5O_{12}$ phase and form a second layer reduced in the crystal defect such as dislocation and endowed with excellent surface smoothness.

The first layer is preferably an Al-containing nitride layer represented by $In_xAl_yGa_{1-x-y}N$ ($0 \leq x \leq 1$, $0 < y \leq 1$, $0 < x+y \leq 1$), such as AlN, AlGaN and InAlGaN, and among these, the first layer is more preferably a single AlN layer, because a uniform continuous film can be formed across both an $Al_2O_3$ phase and an oxide phase containing at least one fluorescence-emitting oxide phase, which are constituting the light-converting material substrate, and an effect of preventing reduction in the surface smoothness or crystallinity of the second layer or semiconductor layer is achieved.

If the film thickness of the first layer is 0.1 μm or less, a difference in height is liable to be produced between the $Al_2O_3$ phase and another oxide phase and if the film thickness is 5 μm or more, the surface is susceptible to cracking. For this reason, the film thickness of the first layer is preferably from 0.1 to 5 μm and, in particular, when the light-converting material substrate consists of an $Al_2O_3$ phase and a $Y_3Al_5O_{12}$:Ce phase and the first layer is a single AlN layer, the film thickness is preferably from 3 to 5 μm.

The second layer constituting the present invention is AlN. The first layer is provided for the purpose of forming a uniform continuous phase across both an $Al_2O_3$ phase and an oxide phase containing at least one fluorescence-emitting oxide phase and is formed under the growth conditions suitable for the purpose, and this yields a tendency that pits, unevenness, defects and the like may be generated on the surface of the first layer and the surface smoothness is reduced (see, FIG. 4). However, according to the present invention, it has been found that when a second layer of AlN is formed on the first layer and the growth conditions of the second layer are adjusted, pits, unevenness, defects and the like generated in the first layer surface are alleviated and a second layer having a surface with a small value of surface roughness (root-mean-square roughness RMS value) indicative of the surface smoothness can be formed and a high-quality semiconductor layer can be also formed on such a second layer, as a result, the characteristics of the light-emitting diode device can be improved.

In the case where the first layer is a single AlN layer and the second layer is an AlN layer, the first layer and the second layer can be distinguished by the dislocation densities of the first layer and the second layer on an oxide phase other than the $Al_2O_3$ phase, constituting the light-converting material substrate, and the first layer has a higher dislocation density than the second layer.

In the present invention, the dislocation density of the second layer of AlN may be $1 \times 10^{12}/cm^2$ or less, preferably $1 \times 10^{10}/cm^2$ or less, more preferably $1 \times 10^9/cm^2$ or less. When the second layer of AlN has such a low dislocation density, a high-quality semiconductor layer, particularly, nitride-based compound semiconductor layer, can be formed on the second layer.

In the composite substrate for the formation of a light-emitting device of the present invention, the second layer of AlN preferably has a surface roughness (root-mean-square roughness, RMS) of 5 nm or less, preferably 2 nm or less, more preferably 1 nm or less, still more preferably 0.7 nm or less. When the second layer of AlN has such a low plane smoothness, a high-quality semiconductor layer, particularly, nitride-based compound semiconductor layer, is advantageously formed on the second layer.

As for the growth conditions for forming the second layer of AlN having a lower dislocation density than the first layer and having a surface with small surface smoothness, growth conditions where in the second layer, the ratio between the rate at which AlN grows in the direction parallel to the substrate surface and the rate at which it grows in the direction perpendicular to the substrate surface is larger than that in the first layer, are preferred. Furthermore, growth conditions where in the second layer, the rate at which AlN grows in the direction parallel to the substrate surface is higher than the rate at which it grows in the direction perpendicular to the substrate surface are more preferred, and a higher ratio between the rate at which AlN grows in the direction parallel to the substrate surface and the rate at which it grows in the direction perpendicular to the substrate surface is more preferred. By forming the second layer under such AlN growth conditions, pits, unevenness, defects and the like generated in the surface when forming the first layer can be alleviated and a second layer having a surface with excellent surface smoothness can be obtained. Examples of the conditions for realizing the growth where in the second layer, the rate at which AlN grows in the direction parallel to the substrate surface is higher than the rate at which it grows in the direction perpendicular to the substrate surface as compared with the first layer include, for example, the conditions of allowing AlN to grow at a higher temperature than the growth temperature when the first layer is of AlN, and the conditions of making the N/Al ratio (by mol) of the Al raw material and the N raw material in the vapor-phase growth process smaller than the N/Al ratio when the first layer is of AlN.

The film thickness of the second layer is preferably from 2 to 9 μm. If the film thickness of the second layer is less than 2 μm, pits or unevenness in the first layer surface may be insufficiently filled and the surface may have low crystallinity or smoothness, whereas if the film thickness exceeds 9 μm, cracks or abnormal nuclei are liable to be generated. In particular, in order to form a second layer having a lower dislocation density (for example, $1 \times 10^9/cm^2$ or less) and excellent surface smoothness, the film thickness is preferably from 5 to 7 μm.

The light-emitting diode device of the present invention is obtained by forming a semiconductor layer containing a light-emitting layer, on the above-described composite substrate for the formation of a light-emitting device.

The semiconductor layer comprising a light-emitting layer is preferably composed of a nitride-based compound semiconductor represented by $In_xAl_yGa_{1-x-y}N$ ($0 \leq x \leq 1$, $0 \leq y \leq 1$, $0 \leq x+y \leq 1$).

The light-emitting layer is preferably a nitride layer capable of emitting at least visible light, and new pseudo light can be obtained according to the wavelength of mixed light resulting from mixing of fluorescence after wavelength conversion of visible light on passing through the light-converting material substrate constituting the composite substrate for the formation of a light-emitting device of the present invention, with visible light before conversion. Furthermore, the visible light preferably emits a violet-to-blue color at a wavelength of 400 to 500 nm. In the case where the emission color is a violet-to-blue color, yellow fluorescence is generated from the $Y_3Al_5O_{12}$:Ce crystal when light from the light-emitting layer is incident on the $Y_3Al_5O_{12}$:Ce single crystal constituting the light-converting material substrate, and the violet-to-blue light transmits as it is through the $Al_2O_3$ crystal. These light rays are mixed by the continuous and three-dimensionally interentangled texture in the light-converting material substrate and released, so that homogeneous white color free from color unevenness can be obtained.

The production method of the composite substrate for the formation of a light-emitting device of the present invention is described below.

In the method for producing the light-converting material constituting the present invention, the solidified body constituting the light-converting material substrate is produced by melting and then solidifying the raw material metal oxide. For example, the solidified body can be obtained by a simple and easy method where a melt charged into a crucible kept at a predetermined temperature is cooled and solidified while controlling the cooling temperature. A solidified body produced by a unidirectional solidification process is most preferred, because by performing unidirectional solidification, the crystal phase contained continuously grows as a single crystal and each phase comes to have a single crystal orientation.

In the production method of the composite substrate for the formation of a light-emitting device of the present invention, the formation up to the semiconductor layer of the light-emitting diode device in the following first to third steps can be performed in the same apparatus and therefore, is preferably performed by the MOCVD method.

In the case of using the MOCVD method, in the first step, the light-converting material substrate is introduced into an MOCVD apparatus and thereafter, for removing adsorbed gas, dust and the like on the substrate surface, subjected to thermal cleaning at a temperature of 1,000 to 1,300° C. for 5 to 15 minutes by flowing an $H_2$ gas and an $N_2$ gas. The temperature during thermal cleaning is set to the formation temperature of the nitride layer on the substrate or a temperature higher than that, whereby the effect on the film quality by degassing or the like at the temperature when forming the nitride layer can be reduced.

Thereafter, an $H_2$ gas, an $N_2$ gas and an $NH_3$ gas are flowed at a temperature of 1,000 to 1,300° C. and for forming a thin nitride film layer on the substrate surface, a nitridation treatment is performed for approximately from 10 to 120 minutes. This nitride film layer is a layer to be a nucleus when forming an Al-containing nitride layer immediately above the substrate and in particular, when the other oxide phase constituting the light-converting material substrate is the $Y_3Al_5O_{12}$:Ce phase, for forming a high-quality nitride layer thereon, a nitridation treatment under the conditions of a pressure of 76 Torr, a temperature of 1,270° C., an $H_2$ gas flow rate of 12 slm, an $N_2$ gas flow rate of 3 slm, an $NH_3$ gas of 50 sccm and 90 minutes is preferred.

After the thermal cleaning and nitridation treatment of the light-converting material substrate, as the second step, formation of a first layer of an Al-containing nitride layer is preformed. At this time, $In_xAl_yGa_{1-x-y}N$ ($0 \leq x \leq 1$, $0 < y \leq 1$, $0 < x+y \leq 1$) is preferably used for the nitride layer formed immediately above the substrate, and the first layer can be formed at a temperature of 400 to 1,300° C. Particularly, for forming the nitride layer over the entire surface of the light-converting material substrate, the formation temperature is preferably from 1,000 to 1,300° C. Also, the first layer may be, for example, a multilayer film where an AlN buffer layer is formed at a temperature of 400 to 600° C. and an AlGaN layer is formed thereon at a desired temperature, or where an AlN buffer layer is formed at a temperature of 400 to 600° C. and an AlN layer or the like is formed thereon at a temperature higher than the formation temperature of the buffer layer. In particular, when the phase constituting the light-converting material substrate are an $Al_2O_3$ phase and a $Y_3Al_5O_{12}$:Ce phase, a single AlN layer is most preferred because a highest-quality film can be formed across both phases, and the conditions when forming the AlN layer depend on the configuration of the MOCVD apparatus and cannot be indiscriminately specified but are in general preferably a pressure of 50 to 100 Torr ($6.7 \times 10^3$ to $1.3 \times 10^4$ Pa), a temperature of 1,000 to 1,300° C., an $H_2$ gas flow rate of 10 to 14 slm, an $N_2$ gas flow rate of 0.5 to 3 slm, an $NH_3$ gas of 20 to 100 sccm, and an aluminum raw material gas such as TMA (trimethylaluminum) gas of 20 to 100 sccm. The aluminum raw material gas may be TEA (triethylaluminum) gas or the like, other than TMA (trimethylaluminum) gas. Above all, conditions of a pressure of 76 Torr, a temperature of 1,270° C., an $H_2$ gas flow rate of 12 slm, an $N_2$ gas flow rate of 3 slm, an $NH_3$ gas of 50 sccm, and a TMA (trimethylaluminum) gas of 50 sccm are preferred.

As the third step, a second layer of AlN is formed on the first layer. The second layer of AlN is a layer for reducing the unevenness, pits and dislocation density in the surface of the first layer.

As for the growth conditions when forming the second layer of AlN having a lower dislocation density than the first layer and having a surface with small surface smoothness, as described above, growth conditions where in the second layer, the ratio between the rate at which AlN grows in the direction parallel to the substrate surface and the rate at which it grows in the direction perpendicular to the substrate surface is larger than that in the first layer, are preferred. Furthermore, growth condition where in the second layer, the rate at which AlN grows in the direction parallel to the substrate surface is higher than the rate at which it grows in the direction perpendicular to the substrate surface are more preferred, and a higher ratio between the rate at which AlN grows in the direction parallel to the substrate surface and the rate at which it grows in the direction perpendicular to the substrate surface is more preferred.

Incidentally, in the method of the present invention, it is important that the molar ratio between N in the $NH_3$ gas and Al in the Al-containing organic metal compound gas when forming the second layer is smaller than the molar ratio between N in the $NH_3$ gas and Al in the Al-containing organic metal compound gas when forming the first layer. Therefore, in general, the ratio of the supply amount of the N raw material gas ($NH_3$ gas) to the supply amount of the aluminum raw material gas (molar ratio of N to Al) when forming AlN as the first layer is preferably from 80 to 110, more preferably from 90 to 100, and the ratio of the supply amount of the N raw material gas ($NH_3$ gas) to the supply amount of the aluminum raw material gas (molar ratio of N to Al) when forming AlN as the second layer is preferably 57 or less, more preferably 19 or less.

As for the formation conditions of such AlN, the formation temperature is preferably 1,350 to 1,480° C. In particular, when the first layer is a single AlN layer, the formation conditions of the AlN layer for obtaining a high-quality second layer depend on the configuration of the MOCVD apparatus and cannot be indiscriminately specified but are in general preferably a pressure of 50 to 100 Torr ($6.7 \times 10^3$ to $1.3 \times 10^4$ Pa), a temperature of 1,350 to 1,480° C., an $H_2$ gas flow rate of 4 to 14 slm, an $N_2$ gas flow rate of 0.5 to 3 slm, an $NH_3$ gas of 5 to 20 sccm, and an aluminum raw material gas such as TMA (trimethylaluminum) gas of 20 to 100 sccm. The aluminum raw material gas may be TEM (triethylaluminum) gas or the like, other than TMA (trimethylaluminum) gas. Above all, conditions of a pressure of 76 Torr, a temperature of 1,410° C., an $H_2$ gas flow rate of 12 slm, an $N_2$ gas flow rate of 3 slm, an $NH_3$ gas of 10 sccm, and an aluminum raw material gas such as TMA gas of 50 sccm are preferred.

The formation conditions of the second layer are characterized in that, first, the growth temperature is higher compared with the formation conditions of the first layer. Furthermore, the ratio of the supply amount of the N raw material gas ($NH_3$ gas) to the supply amount of the aluminum raw material gas is preferably small. That is, when forming AlN as the second layer, it is preferred that not only the growth temperature is higher but also the $NH_3$ gas and the TMA gas are set to make the molar ratio between nitrogen atom and aluminum atom in the raw materials lower than the molar ratio in the first layer (the $N_2$ gas here is inert and is not a raw material of AlN and therefore, its amount is not taken into consideration). This is because by setting the molar ratio in the formation of AlN for the second layer to be low, a growth mode where the ratio between the rate at which AlN formed grows in the direction parallel to the substrate surface and the rate at which it grows in the direction perpendicular to the substrate surface is larger than that in the first layer is established and furthermore, the creation of growth conditions where the rate at which AlN formed growth in the direction parallel to the substrate surface is larger than the rate at which it grows in the direction perpendicular to the substrate surface is promoted. In turn, the unevenness, pits and dislocation density in the first layer surface can be more suitably reduced, and a second layer free from a crystal grain boundary can be obtained on each oxide layer constituting the light-converging material substrate.

For producing a light-emitting diode by using the composite substrate for the formation of a light-emitting device of the present invention, this may be attained by crystal-growing a desired semiconductor layer by a known method on the composite substrate for the formation of a light-emitting device of the present invention. The composite substrate for the formation of a light-emitting device of the present invention is characterized in that by using the second layer as the outermost surface, a desired semiconductor layer can be formed directly thereon, but another layer (intermediate layer) may intervene therebetween.

The crystal growth method for the semiconductor layer or the intermediate layer may be any of a liquid phase process, a gas phase process and the like, and in particular, when the nitride layer of the composite substrate for the formation of a light-emitting device of the present invention is formed by the MOCVD method, the semiconductor layer of the light-emitting diode is also preferably formed by the MOCVD method. Furthermore, the nitride layer constituting the composite substrate for the formation of a light-emitting device of the present invention is excellent of in the crystallinity on the surface, the surface smoothness and the like and therefore, enables epitaxial growth of a semiconductor layer represented by $In_xAl_yGa_{1-x-y}N$ ($0 \leq x \leq 1$, $0 \leq y \leq 1$, $0 \leq x+y \leq 1$).

EXAMPLES

Example 1

An $\alpha$-$Al_2O_3$ powder (purity: 99.99%) and a $Y_2O_3$ powder (purity: 99.999%) were weighed in a molar ratio of 82:18, and a $CeO_2$ powder (purity: 99.99%) is charged, so that $Y_3Al_5O_{12}$ produced through the reaction of oxides accounts for 1 mol. These powders were wet-mixed in ethanol for 16 hours by means of a ball mill and then, the ethanol as the solvent was removed using an evaporator to obtain a raw material powder. The raw material powder was preliminarily melted in a vacuum furnace to prepare a raw material for unidirectional solidification.

This raw material was directly charged into a molybdenum crucible and after setting the crucible in a unidirectional solidification furnace, the raw material was fused under a pressure of $1.33 \times 10^{-3}$ Pa ($10^{-5}$ Torr). In the same atmosphere, the crucible was moved down at a speed of 5 mm/hour to obtain a solidified body composed of a garnet-type crystal $Y_3Al_5O_{12}$:Ce and an α-type aluminum oxide crystal $Al_2O_3$.

Subsequently, the light-converting material substrate was cut such that the (0001) plane of the $Al_2O_3$ crystal and the (111) plane of the $Y_3Al_5O_{12}$:Ce crystal serve as principal surfaces. The substrate was then polished and washed to obtain a light-converting material substrate having a thickness of 0.43 mm.

The obtained light-converting material substrate was introduced into the chamber of an MOCVD apparatus and after adjusting the pressure therein to 76 Torr ($1 \times 10^4$ Pa) in a mixed gas atmosphere at an $H_2$ gas flow rate of 12 slm and an $N_2$ gas flow rate of 3 slm, thermal cleaning of the light-converting material substrate was performed for 5 minutes by raising the temperature to 1,270° C. Thereafter, the substrate surface was nitrided by flowing an $NH_3$ gas at a flow rate of 50 sccm for 90 minutes.

After the thermal cleaning and nitridation, a reaction was allowed to proceed on the light-converting material substrate at a growth temperature of 1,270° C. under the same pressure for 60 minutes at an $H_2$ gas flow rate of 12 slm, an $N_2$ gas flow rate of 3 slm, an $NH_3$ gas flow rate of 50 sccm and a TMA (trimethylaluminum) gas flow rate of 50 sccm, whereby a first layer of AlN was formed to a thickness of about 5 μm.

On the first layer of an AlN layer, a reaction was allowed to proceed at a growth temperature of 1,410° C. under the same pressure for 90 minutes at an $H_2$ gas flow rate of 12 slm, an $N_2$ gas flow rate of 3 slm, an $NH_3$ gas flow rate of 10 sccm and a TMA gas flow rate of 50 sccm, whereby a second layer of AlN was formed to a thickness of about 6 μm.

Figure 2:
FIG. 2 is a cross-sectional SEM photograph of the composite substrate for the formation of a light-emitting device, showing an embodiment of the present invention.

FIG. 2 shows the SEM (scanning electron microscope) photograph of the cross-section of the substrate obtained above. In the light-converting material substrate 1 of FIG. 2, the white portion 6 is the $Y_3Al_5O_{12}$:Ce phase, and the black portion 7 is the $Al_2O_3$ phase. It is seen from the cross-sectional SEM photograph of the second layer 3 of AlN formed further on the first layer 2 which is formed on the light-converting material substrate 1 shown in FIG. 2 that by the formation on the light-converting material substrate 1 under the above-described conditions, the first layer 2 is formed on the $Al_2O_3$ phase and the $Y_3Al_5O_{12}$:Ce phase and the second layer 3 formed on the first layer 2 forms a continuously continuing layer, thereby flattening the surface. Furthermore, the vicinity of the second layer surface was observed by TEM (transmission electron microscope), as a result, the dislocation density was found to be $1.1 \times 10^9$/cm² at most, revealing high crystallinity. Also, the surface roughness was measured by AFM (atomic force microscope), and the surface root-mean-square roughness (RSM) was found to be 0.69 nm.

On the obtained composite substrate for the formation of a light-emitting device, a GaN layer was formed using an $H_2$ gas, an $NH_3$ gas and a TMG (trimethylgallium) gas by a known method according to the MOCVD method, and further thereon, a three-layer quantum well structure-type light-emitting layer comprising an InGaN well layer and a barrier layer was formed using an $H_2$ gas, an $N_2$ gas, an $NH_3$ gas, a TMG gas and a TMI (trimethylindium) gas.

Figure 3:
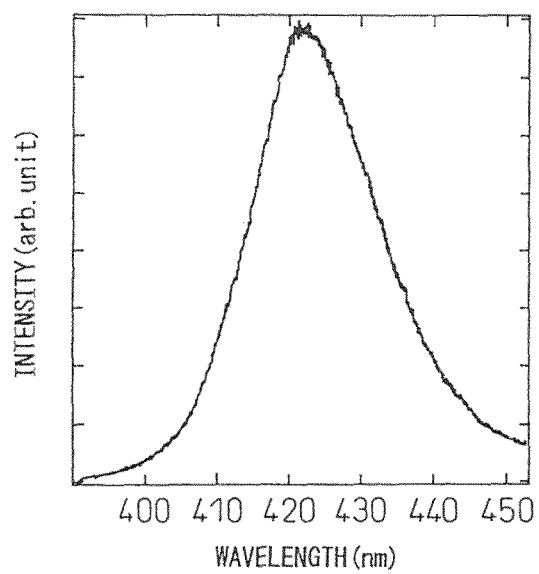
FIG. 3 shows the PL measurement results of the light-emitting layer formed on the composite substrate for the formation of a light-emitting device of the present invention.

FIG. 3 shows the PL (photoluminescence) measurement results of the light-emitting layer obtained above. It is seen from FIG. 3 that luminescence with a peak wavelength of 422 nm is obtained and a high-quality light-emitting layer can be formed on the composite substrate for the formation of a light-emitting device produced in Example above.

Comparative Example 1

For confirming the effect of Example above, the composite substrate for the formation of a light-emitting device of Comparative Example 1 was formed as follows.

First, a light-converting material substrate was introduced into the MOCVD chamber, and cleaning and nitridation of the substrate surface were performed under the same conditions as in Example 1 to form a first layer of an AlN layer.

Figure 4:
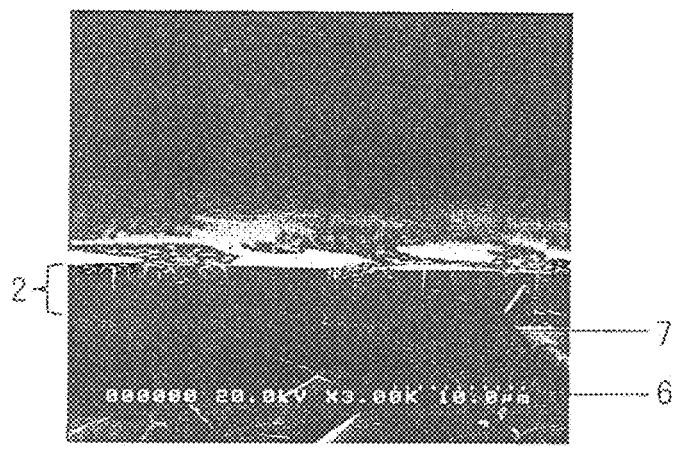
FIG. 4 is a cross-sectional SEM photograph of the first layer formed on the light-converting material substrate for Comparison.

FIG. 4 shows the cross-sectional SEM photograph of the obtained substrate. In the Figure, the white portion 6 is the $Y_3Al_5O_{12}$:Ce phase, and the black portion 7 is the $Al_2O_3$ phase. It is seen from FIG. 4 that the first layer 2 formed on the light-converting material substrate forms a flat film on the $Al_2O_3$ phase but has large surface unevenness on the $Y_3Al_5O_{12}$:Ce phase, revealing a low smoothness (RSM: 5.262 nm). Also, the vicinity of the first layer surface was observed by TEM, as a result, the dislocation density could not be evaluated due to many dislocations.

On the composite substrate for the formation of a light-emitting device obtained in Comparative Example 1, a GaN layer was formed by a known method described in Example 1, and further thereon, a light-emitting layer was formed.

As a result of TEM observation, the GaN layer located on the $Y_3Al_5O_{12}$:Ce phase was found to be a polycrystalline layer containing many crystal defects such as dislocation and crystal grain boundary. Also, the PL (photoluminescence) measurement results revealed that irrespective of the $Al_2O_3$ phase and the $Y_3Al_5O_{12}$ phase, many non-light-emitting regions are present in the light-emitting layer on the phases and the light emission characteristics are bad.

Comparative Example 2

For confirming the effect of Example above, without using the production method of the composite substrate for the formation of a light-emitting device of the present invention, formation of a GaN layer on a light-converting material substrate and formation of a three-layer quantum well structure-type light-emitting layer comprising an InGaN well layer and a barrier layer on the GaN layer were attempted as Comparative Example 2 by the following known method.

First, a light-converting material substrate was introduced into the chamber of an MOCVD apparatus, and cleaning and nitridation of the substrate surface were performed at 1,100° C. Thereafter, the temperature was lowered to 500° C., and a GaN buffer layer was formed on the light-converting material substrate by using an $H_2$ gas, an $N_2$ gas, an $NH_3$ gas and a TMG gas, after the cleaning and nitridation. Subsequently, the temperature was raised to 1,100° C., and a GaN layer (thickness: about 5 μm) was formed at a growth temperature of 1,100° C. by using an $H_2$ gas, an $N_2$ gas, an $NH_3$ gas and a TMG gas.

Figure 5:
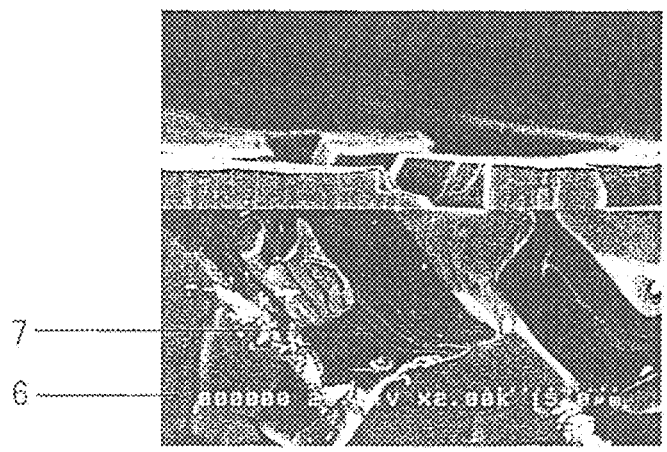
FIG. 5 is a cross-sectional SEM photograph of GaN formed through a GaN buffer layer on the light-converting material substrate for Comparison.

FIG. 5 shows the cross-sectional SEM photograph of the obtained GaN layer. In the Figure, the white portion 6 is the $Y_3Al_5O_{12}$:Ce phase, and the black portion 7 is the $Al_2O_3$ phase. It is seen from FIG. 5 that the GaN layer formed on the light-converting material substrate forms a flat GaN layer on the $Al_2O_3$ phase, but a GaN layer cannot be formed on the $Y_3Al_5O_{12}$:Ce phase, revealing that a difference in height or a step is produced between the GaN layer on the $Al_2O_3$ phase and the GaN layer on the $Y_3Al_5O_{12}$ phase.

Reduction in the light emission characteristics is apparent from these results and therefore, formation of a light-emitting layer on the GaN layer was not performed.

INDUSTRIAL APPLICABILITY

It is evident that the substrate for the formation of a light-emitting device, the formation method thereof, and the light-emitting device using the substrate for the formation of a light-emitting device, provided by the present invention, are useful in industry.

DESCRIPTION OF REFERENCE NUMERALS

1 Light-converting material substrate
2 First layer
3 Second layer
4 Semiconductor layer
5 Composite substrate for the formation of a light-emitting device
6 $Y_3Al_5O_{12}$:Ce Phase
7 $Al_2O_3$ Phase

The invention claimed is:

1. A composite substrate for formation of a light-emitting device, comprising:
    a tight-converting material substrate that radiates at least a part of incident light as light different in wavelength through a surface opposite an incident surface, wherein said light-converting material substrate has a texture comprising two or more oxide phases continuously and three-dimensionally entangled with each other, said two or more oxide phases including an $Al_2O_3$ phase and at least one fluorescence-emitting oxide phase, and
    at least two or more Al-containing nitride layers formed on said light-converting material substrate, wherein said nitride layers have a first layer of an Al-containing nitride layer formed on the light-converting material substrate and a second layer of AlN having a dislocation density of $1\times10^{12}/cm^2$ or less, said first layer having a thickness of from 0.5 to 5 μm and said second layer having a thickness of from 2 to 9 μm,
    wherein said Al-containing nitride layers are layers to ensure a high-quality nitride-based light-emitting diode, optionally, with an intermediate layer therebetween, to be formed thereon.

2. The composite substrate as claimed in claim 1, wherein each of said first layer and said second layer forms a uniform continuous layer on said two or more oxide phases of said light-converting material substrate to extend across all phases and contains substantially no voids.

3. The composite substrate as claimed in claim 1, wherein said second layer has a surface roughness (root-mean-square roughness, RMS of 5 nm or less.

4. The composite substrate as claimed in claim 1, wherein the fluorescence-emitting oxide phase of said light-convening material substrate is $Y_3Al_5O_{12}$:Ce phase.

5. The composite substrate claimed in claim 4, wherein (0001) of said $Al_2O_3$ crystal and (111) of said $Y_3Al_5O_{12}$:Ce crystal serve as principal surfaces of said light-converting material substrate.

6. The composite substrate as claimed in claim 1, wherein the Al-containing nitride layer of said first layer and the AlN layer of said second layer are grown as crystals by the MOCVD method on said light-convening material substrate.

7. The composite substrate as claimed, in claim 1, wherein the Al-containing nitride layer of said first layer is AlN.

8. A light-emitting diode device comprising a semiconductor light-emitting layer formed on said composite substrate of claim 1, wherein said light-emitting diode device radiates light after wavelength conversion of at least a part of light from the semiconductor light-emitting light through said composite substrate to form a light-emitting device.

9. A light-emitting diode device comprising:
    the composite substrate claimed in claim 4; and
    a semiconductor light-emitting layer capable of emitting blue light on said composite substrate,
    wherein said light-emitting diode device radiates light after wavelength conversion of a part of light from said semiconductor light-emitting light, together with light from said semiconductor light-emitting layer, through said composite substrate.

10. A method of producing said composite substrate of claim 1, comprising:
    a first step of subjecting a light-converting material substrate having a texture comprising two or more oxide phases continuously and three-dimensionally entangled with each other, said two or more phases including an $Al_3O_3$ phase and at least one fluorescence-emitting oxide phase to radiate at least a part of incident light as light different in wavelength through the surface opposite the incident surface to a heat treatment at 1,000 to 1,300° C. in a mixed gas atmosphere of an $H_2$ gas, an $N_2$ gas and an $NH_3$ gas,
    a second step of supplying at least an $H_2$ gas, an $N_2$ gas, an $NH_3$ gas and an Al-containing organic metal compound gas on said light-converting material substrate at a temperature of 400 to 1,300° C. to form a first layer of an Al-containing nitride layer having a thickness of from 0.5 to 5 μm, and
    a third step of supplying a mixed gas of an $H_2$ gas, an $N_2$ gas, an $NH_3$ gas and an Al-containing organic metal compound gas on said first layer at 1,350 to 1,480° C. to form a second layer of AlN having a thickness of from 2 to 9 μm.

11. The method as claimed in claim 10, wherein said first step, said second step and said third step are performed by the MOCVD method.

12. The method as claimed in claim 10, wherein a molar ratio between N in the $NH_3$ gas and Al in the Al-containing organic metal compound was in said third step is smaller than a molar ratio between N in the $NH_3$ gas and Al in the Al-containing organic metal compound gas in said second step.

13. The method as claimed in claim 10, wherein a heat treatment time period in said first step is from 10 to 90 minutes.

14. The method as claimed in claim 10, wherein said Al-containing nitride layer is AlN.

15. The composite substrate as claimed in claim 2, wherein said second layer has a surface roughness (root-mean-square roughness, RMS) of 5 nm or less.

16. The composite substrate as claimed in claim 1, wherein film thickness of said second layer is from 4 μm to 9 μm.

17. The method as claimed in claim 11, wherein a molar ratio between N in the $NH_3$ gas and Al in the Al-containing organic metal compound as in said third step is smaller than a molar ratio between N in the $NH_3$ gas and Al in the Al-containing organic metal compound gas in said second step.

18. The composite substrate as claimed in claim 1, wherein said second layer of AlN has a dislocation density of $1\times10^9/\text{cm}^2$ less.

19. The method according to claim 10, wherein said first layer of an Al containing nitride layer is formed at a temperature of 1,000 to 1,300° C.

* * * * *